United States Patent
Mori et al.

(10) Patent No.: US 9,379,038 B2
(45) Date of Patent: Jun. 28, 2016

(54) HEAT DISSIPATION DEVICE AND SEMICONDUCTOR DEVICE

(75) Inventors: Shogo Mori, Kariya (JP); Yoshitaka Iwata, Kariya (JP); Satoshi Watanabe, Kariya (JP); Kenji Tsubokawa, Satsumasendai (JP); Toshio Kawaguchi, Satsumasendai (JP)

(73) Assignees: KABUSHIKI KAISHA TOYOTA JIDOSHOKKI, Aichi-Ken (JP); KYOCERA CORPORATION, Kyoto (JP)

( * ) Notice: Subject to any disclaimer, the term of this patent is extended or adjusted under 35 U.S.C. 154(b) by 48 days.

(21) Appl. No.: 13/643,227

(22) PCT Filed: Apr. 28, 2011

(86) PCT No.: PCT/JP2011/060447
§ 371 (c)(1), (2), (4) Date: Oct. 24, 2012

(87) PCT Pub. No.: WO2011/136362
PCT Pub. Date: Nov. 3, 2011

(65) Prior Publication Data
US 2013/0039010 A1  Feb. 14, 2013

(30) Foreign Application Priority Data
Apr. 28, 2010 (JP) .................. 2010-104135

(51) Int. Cl.
*F28F 7/00* (2006.01)
*H01L 23/473* (2006.01)
(Continued)

(52) U.S. Cl.
CPC .......... *H01L 23/473* (2013.01); *H01L 21/4882* (2013.01); *H01L 23/3731* (2013.01); *H05K 7/20254* (2013.01); *H01L 2924/0002* (2013.01)

(58) Field of Classification Search
CPC ............ H01L 23/4093; H01L 23/4006; H01L 23/467

USPC ..................... 361/719; 165/104.33
See application file for complete search history.

(56) References Cited

U.S. PATENT DOCUMENTS 7,044,196 B2 * 5/2006 Shook ..................... F04B 17/00
165/104.33
7,044,198 B2 * 5/2006 Matsushima ............. F28F 3/12
165/170

(Continued)

FOREIGN PATENT DOCUMENTS

JP 47-036973 11/1972
JP 63-064347 3/1988

(Continued)

OTHER PUBLICATIONS

Office Action from Japan Patent Office (JPO) in Japanese Patent Application No. 2012-512919, dated Aug. 25, 2015.
(Continued)

*Primary Examiner* — Cuong Q Nguyen
*Assistant Examiner* — Nishath Yasmeen
(74) *Attorney, Agent, or Firm* — Greenblum & Bernstein, P.L.C.

(57) ABSTRACT

Disclosed is a heat dissipation device which is reduced in the number of components, while having sufficient insulating function and cooling function with respect to an object to be cooled. The heat dissipation device includes a base that is formed from a ceramic and a refrigerant channel for circulating a refrigerant within the base. The base is formed by sintering a stacked body in which a plurality of ceramic sheets are stacked. The plurality of ceramic sheets include the ceramic sheet which is provided with a plurality of slits that constitute the refrigerant channel, and the ceramic sheets which are provided with communication paths that communicate the refrigerant channel and outside units with each other. A semiconductor device is configured by bonding a metal plate, on which a semiconductor element is mounted, to the heat dissipation device.

11 Claims, 8 Drawing Sheets

(51) Int. Cl.
   *H01L 23/373*   (2006.01)
   *H05K 7/20*    (2006.01)
   *H01L 21/48*   (2006.01)

(56) References Cited

U.S. PATENT DOCUMENTS

| | | |
|---|---|---|
| 2008/0179972 A1 | 7/2008 | Aoki et al. |
| 2009/0139704 A1 | 6/2009 | Otoshi et al. |
| 2009/0314474 A1 | 12/2009 | Kimbara et al. |
| 2010/0090336 A1 | 4/2010 | Yoshida et al. |

FOREIGN PATENT DOCUMENTS

| | | | |
|---|---|---|---|
| JP | 63-080856 | | 5/1988 |
| JP | 06-268127 | | 9/1994 |
| JP | 10-308486 | * | 11/1998 |
| JP | 2005-166855 | | 6/2005 |
| JP | 2006-294699 | | 10/2006 |
| JP | 2006-310485 | | 11/2006 |
| JP | 2007-012719 | * | 1/2007 |
| JP | 2007-184479 | * | 7/2007 |
| JP | 2007-258458 | | 10/2007 |
| JP | 2008-103400 | | 5/2008 |
| JP | 2008-172014 | | 7/2008 |
| JP | 2008-186820 | | 8/2008 |
| JP | 2010-093020 | | 4/2010 |
| JP | 2011-230954 | | 11/2011 |

OTHER PUBLICATIONS

Korea Office action, mail date is Jun. 12, 2014.
International Preliminary Report on Patentability for PCT/JP2011/060447, mailed Dec. 10, 2012.
International Search Report, mail date is Aug. 2, 2011.

* cited by examiner

HEAT DISSIPATION DEVICE AND SEMICONDUCTOR DEVICE

FIELD OF THE DISCLOSURE

The present invention relates to a heat dissipation device formed by stacking ceramic sheets. The present invention also relates to a semiconductor device formed by joining a metal plate, on which a semiconductor element is mounted, to the heat dissipation device.

BACKGROUND OF THE DISCLOSURE

In the prior art, patent document 1 discloses an example of a semiconductor device, or semiconductor module, including a circuit substrate formed by joining a metal plate of pure aluminum or the like on the two opposite surfaces of a ceramic substrate, or insulative substrate, of aluminum nitride or the like. A heat dissipation device, that is, a heat sink, is joined with the circuit substrate to form a module. In this type of semiconductor device, the heat generated by the semiconductor element is dissipated by the heat dissipation device.

PRIOR ART DOCUMENT

Patent Document

Patent Document 1: Japanese Laid-Open Patent Publication No. 2006-294699

SUMMARY OF THE INVENTION

Problems that are to be Solved by the Invention

The semiconductor device of the above document uses the ceramic substrate to implement an insulating function for the circuit substrate, and the heat dissipation device is formed from aluminum, which has superior heat conductance and is light in weight. Thus, the semiconductor device of the above document includes a large number of components.

The present invention addresses the problems of the prior art. It is an object to provide a heat dissipation device and a semiconductor device that allows for reduction in the number of components while satisfying the insulating function and the cooling function.

Means for Solving the Above Problem

To solve the above problem, one aspect of the present invention provides a heat dissipation device including a base body, which is formed from a ceramic, and a refrigerant flow path, through which a refrigerant flows in the base body. The base body is formed by sintering a stacked body, which is formed by stacking a plurality of ceramic sheets. The ceramic sheets include a ceramic sheet that has a plurality of slits forming the refrigerant flow path and a ceramic sheet that has a communication path communicating the refrigerant flow path and exterior to each other.

In this structure, the heat dissipation device is formed by stacking and sintering a plurality of ceramic sheets. This allows for the heat dissipation device to implement a cooling function and an insulating function. Thus, when the heat dissipation device of the present invention is applied to, for example, a semiconductor device, a metal plate that functions as a wiring layer on which a semiconductor element is mounted can be directly joined with the heat dissipation device. Accordingly, the heat dissipation device can implement an insulating function and a cooling function, while reducing the number of components.

Preferably, the base body includes a mounting surface on which a cooling subject is mounted, and the communication path includes a refrigerant inlet and a refrigerant outlet that open in the mounting surface. In this structure, the refrigerant inlet of the heat dissipation device and the refrigerant outlet of the heat dissipation device open in the mounting surface of the base body on which the cooling subject is mounted. This allows a pipe line for supplying refrigerant and a pipe line for discharging the refrigerant to be connected to the mounting surface. Thus, components required for the heat dissipation device can be arranged in a concentrated state on the mounting surface. Accordingly, the heat dissipation device can be reduced in size.

Preferably, the base body includes a mounting surface on which a cooling subject is mounted, and the refrigerant flow path is formed to be undulated in a planar view of the base body viewed from the mounting surface. In this structure, compared to when the refrigerant flow path is formed to be linear in the planar view, the surface area of the refrigerant flow path can be increased. Accordingly, the cooling capacity can be improved.

Preferably, the ceramic sheet that includes the slits is formed from a material having high mechanical strength. In this structure, the strength of the ceramic sheet is increased thereby allowing for the formation of narrow refrigerant flow paths. As a result, the cooling capacity of the heat dissipation device can be improved.

Preferably, the refrigerant flow path includes at least one partition that partitions the slit in an extending direction of the slit. In this structure, the partition functions as a beam. Thus, during the manufacturing of the heat dissipation device, when a plurality of ceramic sheets are stacked and joined with one another, deformation of the ceramic sheets and stacking displacements that would be caused by insufficient strength are prevented.

Preferably, a plurality of the partitions form at least one ladder-like chain. It is desirable that the ladder-like chain be formed so that the partitions are arranged in a state sequentially shifted in an order in which the ceramic sheets are stacked when the refrigerant flow path is viewed along a cross-section extending in the extending direction of the slit and extending in a stacking direction of the ceramic sheets. In this structure, the direction of the flow of refrigerant in the refrigerant flow path changes at each partition forming a step of the ladder. Thus, a radial diffusion flow easily occurs. This further effectively exchanges heat between the cooling subject and the refrigerant and improves the cooling capacity of the heat dissipation device.

Preferably, when the refrigerant flow path is viewed along a cross-section extending in the extending direction of the slit and extending in the stacking direction of the ceramic sheets, the heat dissipation device includes a bottom plate portion located at an opposite side of the mounting surface. The bottom plate portion defines a bottom surface of the refrigerant flow path. It is desirable that the bottom surface of the refrigerant flow path includes a projection portion projecting toward the mounting surface. In this structure, the projection portion at the bottom surface of the refrigerant flow path changes the direction of the flow of refrigerant in the refrigerant flow path toward the mounting surface on which the cooling subject is mounted. This further effectively exchanges heat between the cooling subject and the refrigerant and improves the cooling capacity of the heat dissipation device.

Preferably, when viewing the refrigerant flow path along a cross-section perpendicular to the extending direction of the slit, two side surfaces of the refrigerant flow path form two boundary lines between the slit and the base body. It is preferable that the two boundary lines are bent to be symmetric at opposite sides of the slit and each have a bent shape to cover a square. In this structure, at a cross-section perpendicular to the extending direction of the slit, the refrigerant flow path has a shape in which wide and narrow parts are repeated in the height direction, that is, between the mounting surface and the bottom surface. Thus, part of the flow of refrigerant in the height direction forms an eddy flow at a narrow portion thereby causing turbulence. Further, the repeated narrow and wide parts in the cross-section of the refrigerant flow path increase the surface area of the refrigerant flow path. These two effects further effectively advance heat exchange between the refrigerant and the base body. This improves the cooling capacity of the heat dissipation device.

Preferably, when viewing the refrigerant flow path along a cross-section perpendicular to the extending direction of the slit, two side surfaces of the refrigerant flow path form two boundary lines between the slit and the base body. It is preferable that the two boundary lines are both bent in the same direction each have a bent shape to cover a square. In this structure, at a cross-section perpendicular to the extending direction of the slit, the refrigerant flow path has a shape zigzagged in the height direction, that is, between the mounting surface and the bottom surface. Thus, the flow of refrigerant in the height direction becomes a crooked flow. Further, the surface area of the refrigerant flow path is increased. These two effects further effectively advance heat exchange between the refrigerant and the base body. This improves the cooling capacity of the heat dissipation device.

Preferably, the refrigerant flow path includes at least one constriction portion that constricts the refrigerant flow path in a width direction or a height direction. In this structure, the refrigerant flowing through the refrigerant flow path produces turbulence when passing by the constriction portion. This further effectively advances heat exchange between the refrigerant and the base body and improves the cooling capacity of the heat dissipation device.

Preferably, a semiconductor device includes a semiconductor element, a metal plate on which the semiconductor element is mounted, and the heat dissipation device described above that is joined with the metal plate. The base body of the heat dissipation device includes a mounting surface on which a cooling subject is mounted. The metal plate is joined with the mounting surface to form the semiconductor device.

In this structure, the metal plate that functions as a wiring layer on which a semiconductor element is mounted is directly joined with the heat dissipation device to form the semiconductor device. Accordingly, the semiconductor device can implement an insulating function and cooling function, while reducing the number of components.

Preferably, a supply pipe that supplies the refrigerant to the refrigerant flow path is arranged at a refrigerant inlet of the communication path. A discharge pipe that discharges the refrigerant that passed through the refrigerant flow path to the exterior is arranged at a refrigerant outlet of the communication path. The supply pipe and the discharge pipe are formed from a soft material. In this structure, even when strong vibrations are applied to the semiconductor device, the pipe that is formed from a soft material, for example, the supply pipe or the discharge pipe absorbs vibration of the semiconductor device.

Preferably, the partitions forming the ladder-like chain are arranged so that the ladder-like chain is inclined to approach the bottom surface of the refrigerant flow path along a flowing direction of the refrigerant flow path from the refrigerant supplying section to the refrigerant discharging section. In this structure, the locations where the refrigerant from a refrigerant supplying section is transferred are sequentially shifted by the ladder-like chain toward the mounting surface on which a cooling subject is mounted. Thus, a radial diffusion flow directed toward the mounting surface is produced. Thus, heat exchanges is enhanced thoroughly between the refrigerant and the cooling subject. Accordingly, the cooling capacity of the heat dissipation device can be further increased.

DETAILED DESCRIPTION OF THE PREFERRED EMBODIMENTS

FIGS. 1 to 5 illustrate one embodiment of the present invention.

Figure 1:
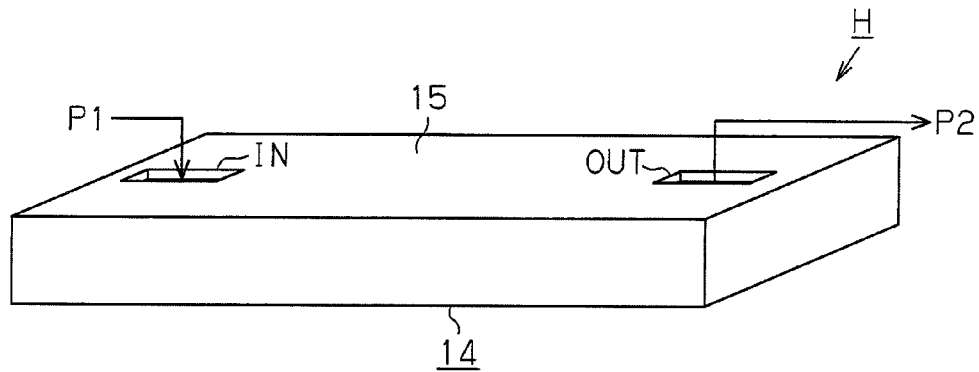
FIG. 1 is a perspective view showing a heat dissipation device of one embodiment.
Figure 2:
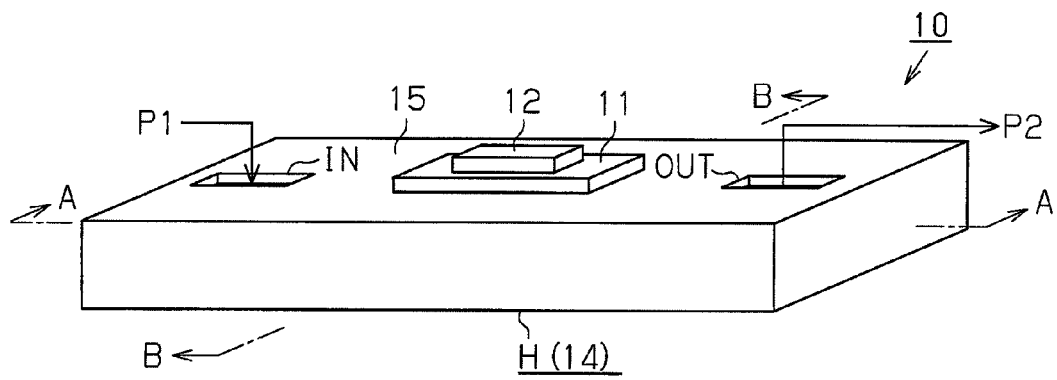
FIG. 2 is a perspective view showing a semiconductor device including the heat dissipation device of FIG. 1.
Figure 3:
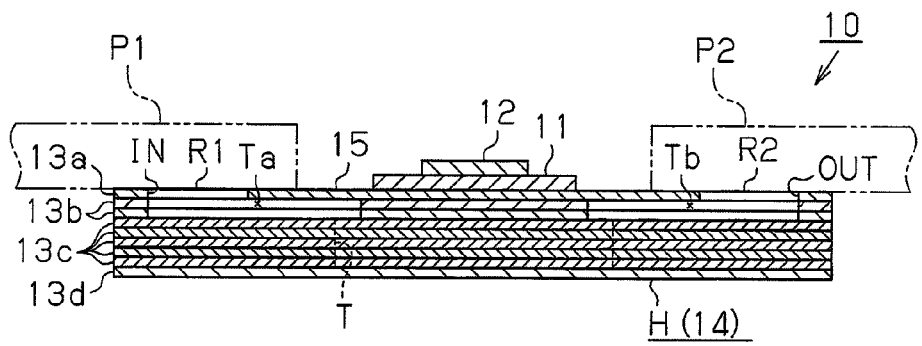
FIG. 3 is a cross-sectional view taken along line A-A in FIG. 2.
Figure 4:
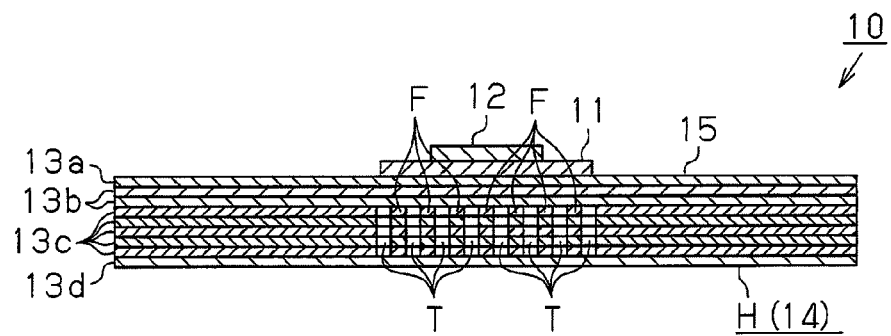
FIG. 4 is a cross-sectional view taken along line B-B in FIG. 2.

A heat dissipation device H shown in FIG. 1 includes a base body 14 formed from a ceramic. FIG. 4 shows refrigerant flow paths T, through which a refrigerant flows, formed in the base body 14. In FIG. 3, the refrigerant flow path T is hidden at the rear of the plane of drawing. FIG. 2 shows one example of a semiconductor device 10 serving as a semiconductor module that uses the heat dissipation device H shown in FIG. 1. The heat dissipation device H shown in FIG. 1 includes a mounting surface 15, on which a cooling subject is mounted. As shown in FIG. 2, a metal plate 11 is joined with the mounting surface 15. The metal plate 11 serves as a metal circuit plate on which a semiconductor element 12 serving as an electronic component is mounted. The semiconductor device 10 is formed in such a manner.

The metal plate 11, which functions as a wiring layer and a joining layer, is formed from a pure aluminum, for example, a 1000 series aluminum that is an industrial pure aluminum, or copper. For example, an IGBT (Insulated Gate Bipolar Transistor) or a diode is used as the semiconductor element 12. Soldering or brazing are performed to join the metal plate 11 and the semiconductor element 12 and to join the metal plate 11 and the heat dissipation device H.

In the present embodiment, the heat dissipation device H is formed by sintering a stacked body formed stacking a plurality of ceramic sheets, each having a thickness of about 1 mm. As the material of the ceramic sheets, aluminum oxide, sulfur nitride, sulfur carbide, aluminum nitride, alumina zirconia, and the like are used. When water cooling is adopted to cool the heat dissipation device, the material of the ceramic sheet preferably has high water resistance.

Figure 5:
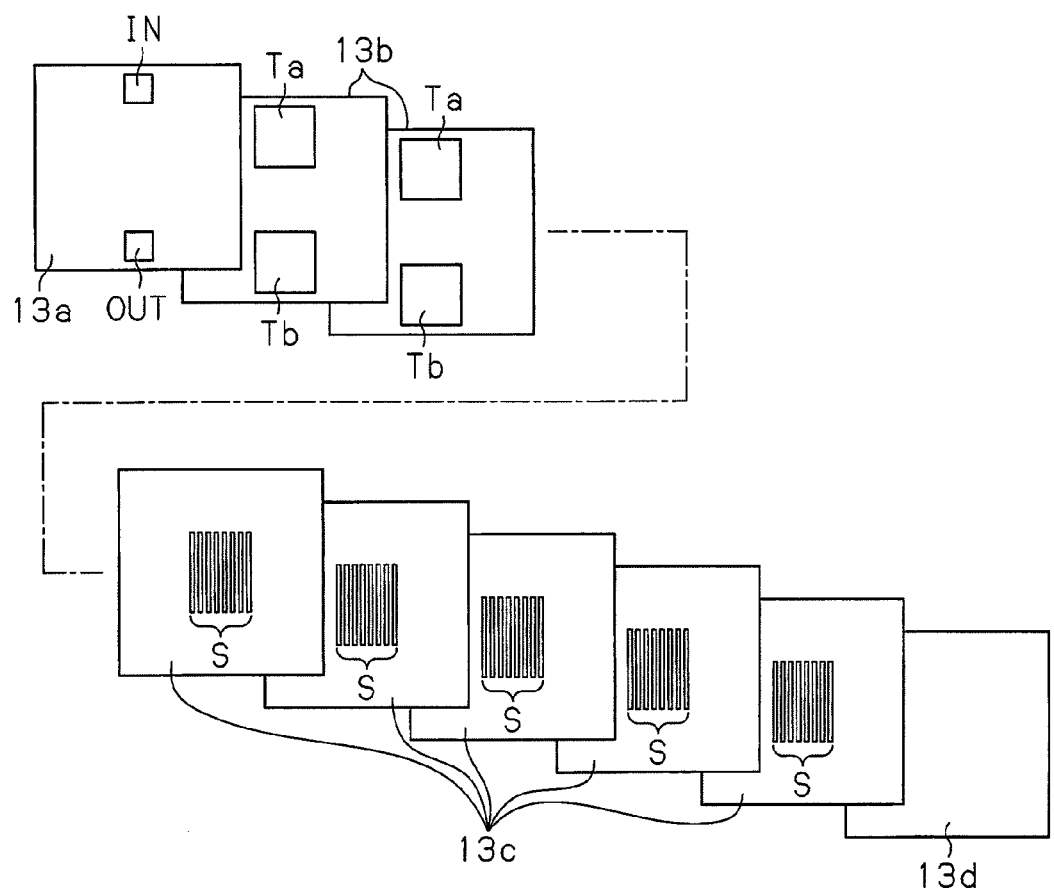
FIG. 5 is a plan view showing a plurality of ceramic sheets forming the heat dissipation device of FIG. 1.

FIG. 5 is an exploded view of the heat dissipation device H showing the plurality of ceramic sheets forming the heat dissipation device H of the present embodiment. Specifically, FIG. 5 shows a first ceramic sheet 13a, a plurality of second ceramic sheets 13b, a plurality of third ceramic sheets 13c, and a fourth ceramic sheet 13d. A portion of the heat dissipation device H including the mounting surface 15, that is, a portion of the heat dissipation device including a joining surface joined with the metal plate 11 is referred to as "top portion of the heat dissipation device H". The first ceramic sheet 13a forms the top portion of the heat dissipation device H. The ceramic sheets may collectively be referred to as ceramic sheets 13. FIG. 5 shows each ceramic sheet 13 as a square so that the positional relationship of refrigerant flow paths in the heat dissipation device H can easily be recognized. However, the ceramic sheets 13 are actually longer in the refrigerant flowing direction than in the width direction, as shown in FIGS. 1 and 2.

The first ceramic sheet 13a includes a refrigerant supplying section IN and a refrigerant discharging section OUT, which have the form of through-holes. In the present embodiment, the refrigerant supplying section IN and the refrigerant discharging section OUT are formed to have the same opening area. A supply pipe P1 (shown in FIG. 1 to FIG. 3), which supplies refrigerant to the heat dissipation device H, is connected to the refrigerant supplying section IN. A discharge pipe P2 (shown in FIG. 1 to FIG. 3), which discharges the refrigerant circulated through the heat dissipation device H outside, is connected to the refrigerant discharging section OUT. In the present embodiment, the refrigerant supplying section IN forms a refrigerant inlet, and the refrigerant discharging section OUT forms a refrigerant outlet.

Each second ceramic sheet 13b includes a first passage formation section Ta, which has the form of a through-hole, located at a position corresponding to the refrigerant supplying section IN of the first ceramic sheet 13a. The second ceramic sheet 13b also includes a second passage formation section Tb, which has the form of a through-hole, located at a position corresponding to the refrigerant discharging section OUT of the first ceramic sheet 13a. The first passage formation section Ta faces the refrigerant supplying section IN, and the second passage formation section Tb faces the refrigerant discharging section OUT. In the present embodiment, the first passage formation section Ta and the second passage formation section Tb are formed to have the same opening area.

Each third ceramic sheets 13c includes a plurality of slits S (fine gaps), which serve as flow path formation sections forming the refrigerant flow path T. The slits S are formed so that the refrigerant flow paths T formed in the heat dissipation device H are arranged at positions corresponding to the mounting portion, which is the portion of the heat dissipation device H on which the semiconductor element 12 that is to be cooled is mounted. Thus, the refrigerant flow paths T are arranged immediately below the semiconductor element 12. Refrigerant flows through the refrigerant flow paths T in the base body of the heat dissipation device H, which is formed from a ceramic. In the present embodiment, each slit S is linear in the planar view. Further, in the present embodiment, the slits S each have the same opening area. Each slit S is longer than the separated distance of the first passage formation section Ta and the second passage formation section Tb in the second ceramic sheet 13b. The fourth ceramic sheet 13d forms a bottom plate portion of the heat dissipation device H at the opposite side of the top portion.

In the present embodiment, a plurality of, five in the present embodiment, third ceramic sheets 13c are stacked on the fourth ceramic sheet 13d, which forms the bottom plate portion of the heat dissipation device H. A plurality of, two in the present embodiment, second ceramic sheets 13b are then stacked thereon, and the first ceramic sheet 13a is further stacked thereon. The first ceramic sheet 13a to the fourth ceramic sheet 13d are stacked in this order to form a stacked body. The third ceramic sheets 13c are stacked so that the slits S extend in the same direction. The second ceramic sheets 13b are stacked so that the first passage formation sections Ta are overlap one another and so that the second passage formation sections Tb overlap one another. The second ceramic sheets 13b are stacked on the third ceramic sheets 13c so that the first passage formation sections Ta are arranged at one side of the slits S and the second passage formation sections Tb are arranged at the other side of the slits S. The first ceramic sheet 13a is stacked on the second ceramic sheets 13b so that the first passage formation sections Ta overlap the refrigerant supplying section IN and the second passage formation sections Tb overlap the refrigerant discharging section OUT. The heat dissipation device H is formed as shown in FIGS. 1 to 4 by sintering the stacked body that is stacked in the above manner.

The heat dissipation device H includes a plurality of, for example, eight in the present embodiment, linear refrigerant flow paths T formed by the slits S of the stacked third ceramic sheets 13c. Solid portions between adjacent refrigerant flow paths T function as fins F having a side surface that faces the refrigerant flow path T. FIG. 3 shows a cross-section of a fin F, with the slit S hidden at the rear of the plane of drawing. In the heat dissipation device H of the present embodiment, the refrigerant flow paths T are respectively formed as independent flow paths. A plurality of, for, example, seven fins F partition the plurality of refrigerant flow path T so that the refrigerant flow paths T are independent from one another. This increases the contact area of the refrigerant, that is, the surface area of the flow path in the heat dissipation device H. Further, since the fourth ceramic sheet 13d forms the bottom of the refrigerant flow paths T and the upper part of the refrigerant flow path T is covered by the first ceramic sheet 13a and the second ceramic sheets 13b, each refrigerant flow path T defines a space closed at a cross-section perpendicular to the direction in which the refrigerant flow path T extends.

In the heat dissipation device H, a first communication path R1 is formed by the refrigerant supplying section IN of the first ceramic sheet 13a and the first passage formation sections Ta of the second ceramic sheets 13b, which are stacked. In the heat dissipation device H, a second communication path R2 is also formed by the refrigerant discharging section OUT of the first ceramic sheet 13a and the second passage formation sections Tb of the second ceramic sheets 13b, which are stacked. As shown in FIG. 3, the first communication path R1 and the second communication path R2 are each connected to the refrigerant flow paths T. The supply pipe P1 is connected to the first communication path R1, and the discharge pipe P2 is connected to the second communication path R2. Thus, the first communication path R1 and the second communication path R2 each communicate the refrigerant flow paths T and the exterior of the heat dissipation device H.

The material of the first ceramic sheet 13a to fourth ceramic sheet 13d is one of aluminum oxide, sulfur nitride, sulfur carbide, aluminum nitride, and alumina zirconia described above or a combination of these materials.

In particular, the first ceramic sheet 13a mounted on (joined with) the metal plate 11 further preferably uses a material that provides for higher insulation, for example, aluminum oxide, sulfur nitride, and alumina zirconia. The second ceramic sheets 13b including the first passage formation section Ta forming part of the first communication path R1 and the second passage formation section Tb forming part of the second communication path R2 further preferably uses a material having high heat conductance, for example, sulfur nitride, sulfur carbide, and aluminum nitride. To increase the cooling capacity, it is preferable that the number of fins F and slits S be increased by, for example, decreasing the widths of the fins F or the widths of the slits S. Thus, the third ceramic sheets 13c including the refrigerant flow paths T defined between the adjacent fins F further preferably uses a material having high mechanical strength and high heat conductance, for example, sulfur nitride.

(Operation)

In the heat dissipation device H, the refrigerant supplied from the refrigerant supplying source flows from the supply pipe P1 to the first communication path R1 and then flows to the refrigerant flow paths T via the first communication path R1. The refrigerant in each refrigerant flow path T flows in the same direction toward the second communication path R2. The heat of the semiconductor element 12 conducted to the heat dissipation device H, that is, the fins F via the metal plate 11 is transferred to the refrigerant flowing through the refrigerant flow path T. The refrigerant, after exchanging heat with the fins F, then reaches the second communication path R2 from the refrigerant flow paths T, and is discharged out of the heat dissipation device H from the discharge pipe P2. As shown in FIG. 3, in the heat dissipation device H of the present embodiment, the refrigerant flows into the heat dissipation device H from the upper surface (mounting surface 15) of the heat dissipation device H, that is, the surface of the heat dissipation device H joined with the metal plate 11, passes through the heat dissipation device H, and is then discharged again from the upper surface (mounting surface 15) of the heat dissipation device H. The heat dissipation device H of the present embodiment also has an insulating function in addition to the cooling function since it is formed from a ceramic material.

The present embodiment thus has the advantages described below.

(1) The plurality of first ceramic sheet 13a to fourth ceramic sheet 13d are stacked and sintered to form the heat dissipation device H. This provides the heat dissipation device H with a cooling function and an insulating function. Thus, the metal plate 11, which functions as a wiring layer on which the semiconductor element 12 is mounted, can be directly joined with the heat dissipation device H to form the semiconductor device 10. Accordingly, the heat dissipation device H and the semiconductor device 10 can reduce the number of components while implementing the insulating function and the cooling function. In other words, the ceramic substrate for satisfying the insulating function and the heat dissipation device for satisfying the cooling function, for example, do not need to be separate bodies in the present embodiment. This differs from the prior art.

(2) The semiconductor device 10 is formed by directly joining the metal plate 11, on which the semiconductor element 12 is mounted, to the heat dissipation device H. Thus, the semiconductor device 10 can be reduced in size.

(3) The slits S in the third ceramic sheets 13c form a plurality of independent and subdivided refrigerant flow paths T. Thus, the present embodiment can increase the surface area of the refrigerant flow path T in the heat dissipation device H as compared to, for example, when using a single flow path having a widened cross-sectional area. This improves the cooling capacity of the heat dissipation device H.

(4) The formation of the plurality of independent refrigerant flow paths T forms the fins F between the adjacent refrigerant flow paths T. Thus, the present embodiment increases the strength of the heat dissipation device H compared to when forming a single flow path in the heat dissipation device H. In other words, the fins F function as a reinforcement material of the heat dissipation device H in addition to increasing the surface area of the refrigerant flow path T. Since the heat dissipation device H can be formed to be thin by increasing the strength of the heat dissipation device H, the distance between the semiconductor element 12, which is a heat source, and the refrigerant flow paths T in the heat dissipation device H can be reduced. Thus, the heat resistance of the heat dissipation device H can be decreased and the heat conductance can be increased. This improves the cooling capability.

(5) The degree of design freedom for the refrigerant flow paths T can be improved since the refrigerant flow paths T are formed by the slits S of the third ceramic sheet 13c. In other words, the refrigerant flow paths T that can implement the required cooling performance can easily be formed in accordance with the shape, the amount of generated heat, mounting position, and the like of the semiconductor element 12 that is subject to cooling. The refrigerant flow paths T corresponding to the semiconductor element 12 can be easily formed even when mounting a plurality of semiconductor elements 12 on the metal plate 11.

(6) The refrigerant inlet, or the refrigerant supplying section IN of the heat dissipation device H, and the refrigerant outlet, or the refrigerant discharging section OUT of the heat dissipation device H, both open in the surface joined with the metal plate 11, that is, the mounting surface 15 of the heat dissipation device H. Thus, a pipe line, that is, the supply pipe P1 for supplying the refrigerant, and a pipe line, that is, the discharge pipe P2 for discharging the refrigerant can be connected to the surface joined with the metal plate 11. Thus, components necessary for the semiconductor device 10, for example, the metal plate 11 and the semiconductor element 12 can be arranged in a concentrated manner on the surface joined with the metal plate 11. Accordingly, the semiconductor device 10 can easily be reduced in size.

(7) The heat dissipation device H is a sintered body. Thus, the heat dissipation device H can implement the necessary cooling performance and prevent the occurrence of water leakage when the heat dissipation device H employs water cooling.

The present embodiment may be modified as below.

Figure 6:
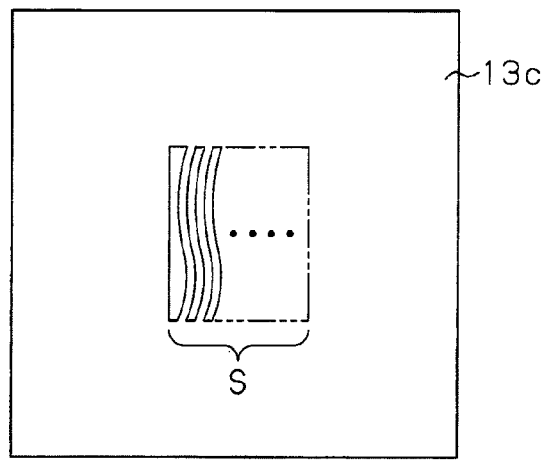
FIG. 6 is a plan view showing a ceramic sheet of another example.

As shown in FIG. 6, the slits S formed in the third ceramic sheet 13c may be undulated in the planar view. That is, in the planar view of the base body 14 viewed from the mounting surface 15 on which the cooling subject is mounted, the slits S may be formed to be undulated. When the slits S are formed in such a manner, the refrigerant flow paths formed in the heat dissipation device H are undulated in the planar view. The refrigerant flow paths that are undulated in the planar view disturbs the flow of the refrigerant and further increases the cooling capacity with a turbulence effect as compared to when the refrigerant flow paths are formed to be linear in the planar view.

The third ceramic sheet 13c may include slits S of different shapes. Specifically, when mounting a plurality of semiconductor elements 12 on the metal plate 11, the refrigerant flow paths T may be formed by slits S having shapes that differ in accordance with the heat generation amount of the semiconductor element 12. For instance, slits S forming linear refrigerant flow paths T in the planar view are formed in correspondence with the portion of the heat dissipation device H at which the semiconductor element 12 is mounted where the amount of generated heat is relatively small. Slits S forming undulated refrigerant flow paths T in the planar view are formed in correspondence with the portion of the heat dissipation device H at which the semiconductor element 12 is mounted where the amount of generated heat is relatively large. Thus, the refrigerant flow paths T having different shapes can easily be formed when the heat dissipation device H as a stacked structure including a plurality of ceramic sheets.

The cooling method of the heat dissipation device H may be air cooling. In such a case, cooling gas such as air flows through the refrigerant flow path T.

The stacked number of ceramic sheets forming the heat dissipation device H may be changed. For example, the stacked number is increased or decreased according to the cross-sectional area (flow path area) of the refrigerant flow path T formed in the heat dissipation device H. The stacked number may be increased or decreased in accordance with the size (depth) of the first communication path R1 and the second communication path R2.

The number of slits S forming the third ceramic sheet 13c may be changed. The number of slits S is changed by the area of the semiconductor element 12 mounted on the metal plate 11, the passage width of the refrigerant flow path T, and the like. In other words, when the area of the region forming the refrigerant flow path T is the same, the number of slits S in a single third ceramic sheet 13c decreases if the passage width of the slits S is increased. On the other hand, the number of slits S in a single third ceramic sheet 13c increases if the passage width of the slit S is decreased.

Figure 7:
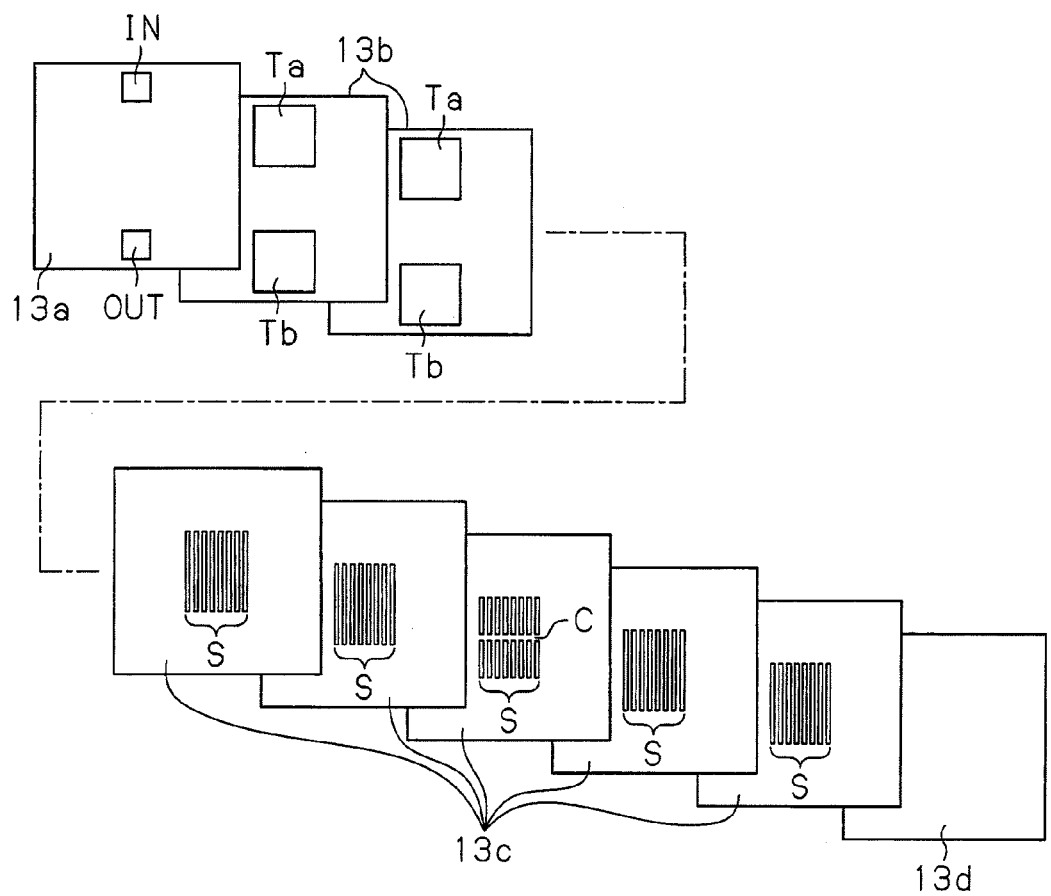
FIG. 7 is a plan view showing a plurality of ceramic sheets forming a further heat dissipation device.

As shown in FIG. 7, a partition C that divides the slits S in the extending direction of the slits S may be arranged in the refrigerant flow paths T. FIG. 7 shows a plan view of the first ceramic sheet 13a to the fourth ceramic sheet 13d forming the heat dissipation device H in another example. In this example, the partition C is arranged in the third ceramic sheet 13c to divide the refrigerant flow path T (slit S) in the extending direction of the slit S. That is, the partition C extends across the refrigerant flow paths T and the slits S. In this example, the partition C is formed in the middle (third) third ceramic sheet 13c of the five third ceramic sheets 13c. The single partition C extends across near the middle of each slit S in the extending direction. In the example of FIG. 7, one partition C is formed, but a plurality of partitions C may be formed to be distributed over the extending direction of the slits S. In FIG. 7, the partition C is formed in a single third ceramic sheet 13c. However, the partition C may be formed in each of a plurality of, for example, two third ceramic sheets 13c.

For instance, when the number of fins F and slits S is increased by decreasing the widths of the fins F or the widths of the slits S, the heat exchange between the refrigerant R and a base body 20 increases thereby improving the cooling efficiency. However, in the manufacturing stage of the heat dissipation device H, when the third ceramic sheets 13c are stacked and joined with each other, insufficient strength may deform the third ceramic sheets 13c or cause stacking displacements. Thus, when one or more partitions C are arranged to extend across the refrigerant flow paths T as shown in FIG. 7, the partition C functions as a beam and ensures the strength of the fins F. Thus, the partition C can prevent deformation and stacking displacements of the slit S and the fin F. It is preferred that the partitions C be slightly shifted from one another to prevent separation between the third ceramic sheets 13c and ensure the formation of the refrigerant flow paths T when the third ceramic sheets 13c are stacked and pressurized to be joined with one another so that the pressurization force is transmitted to the third ceramic sheets 13c or the third ceramic sheets 13c are sufficiently joined with each other.

Figure 8:
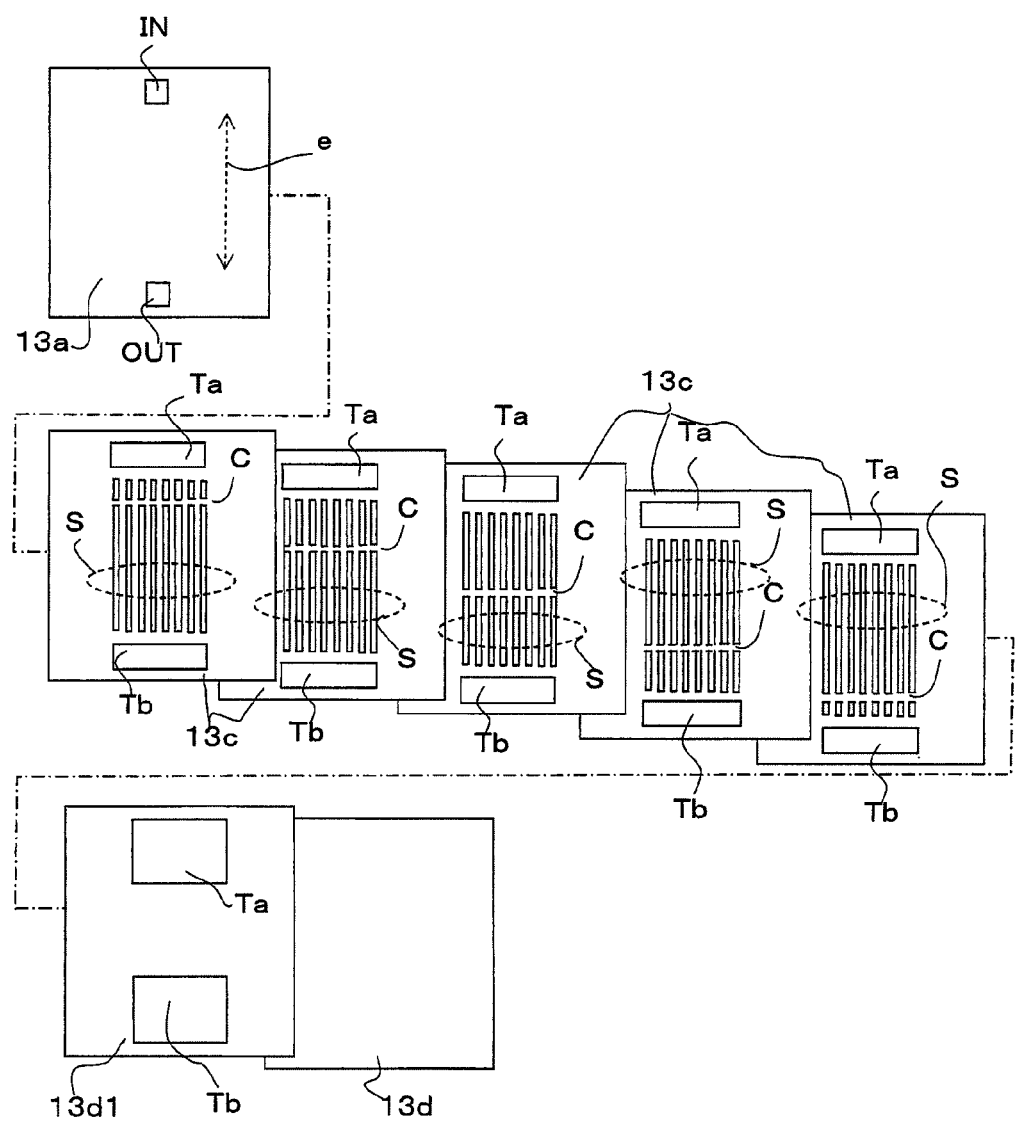
FIG. 8 is a plan view showing a plurality of ceramic sheets forming a heat dissipation device of a further example.
Figure 9:
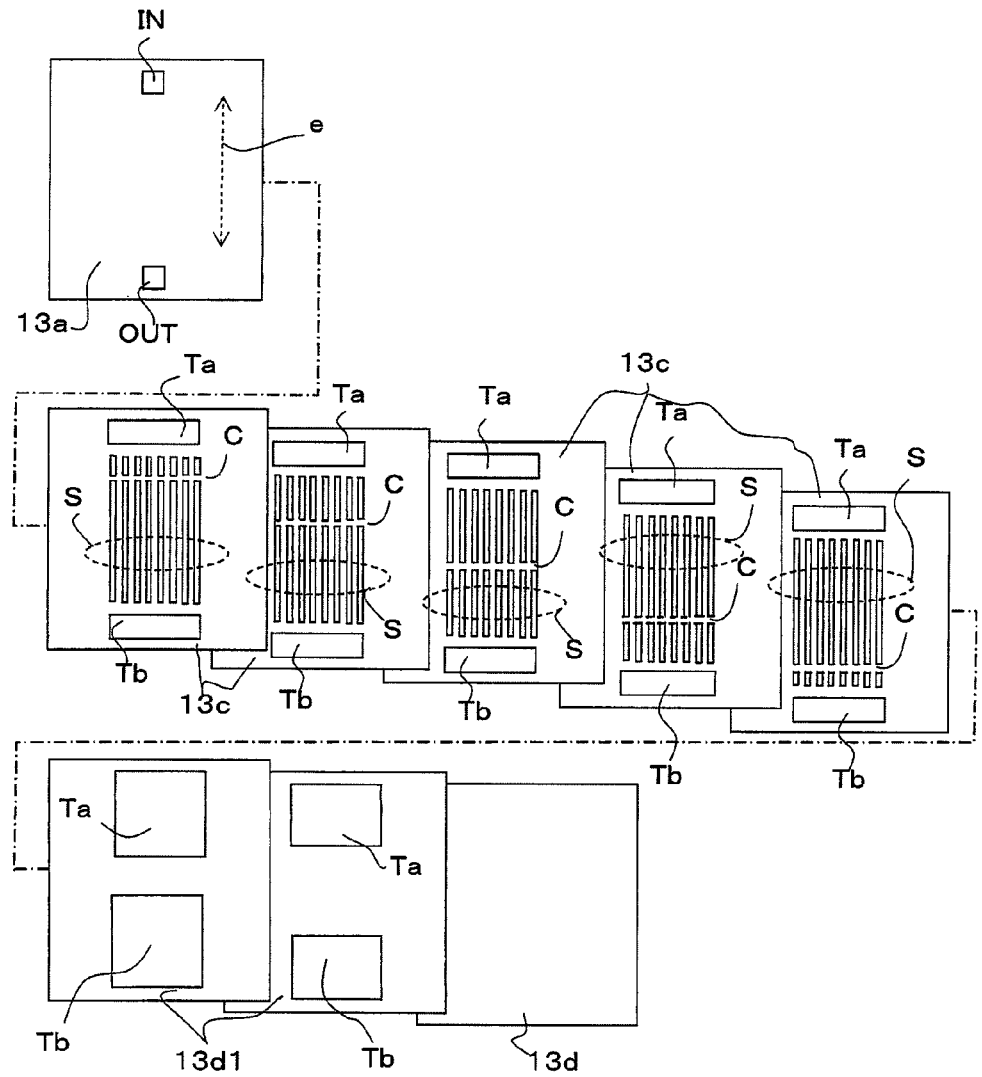
FIG. 9 is a plan view showing a plurality of ceramic sheets forming a heat dissipation device of a further example.
Figure 10:
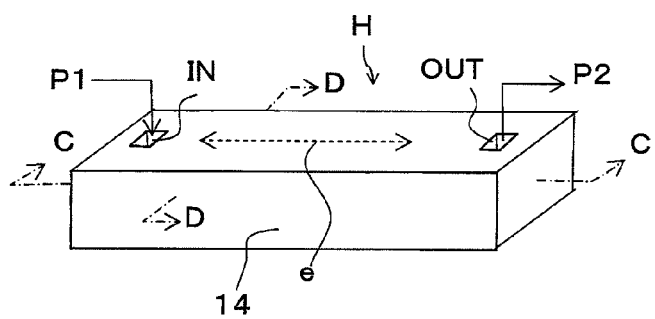
FIG. 10 is a perspective view showing a heat dissipation device formed by the ceramic sheets of FIG. 9.
Figure 11:
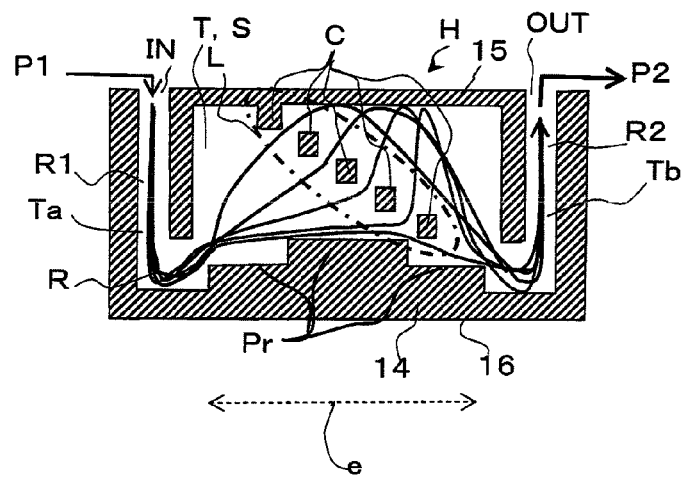
FIG. 11 is a cross-sectional view taken along line C-C in FIG. 10 and diagrammatically shows the flow of a refrigerant in a refrigerant flow path formed by the ceramic sheet of FIG. 9.

In the embodiment of FIG. 8 and the embodiment of FIG. 9 to FIG. 11, the partition C is formed in each of a plurality of, for example, five third ceramic sheets 13c. The partitions C are formed in a sequentially shifted manner in the stacked order of the third ceramic sheets 13c. FIG. 8 shows an embodiment using a single fifth ceramic sheet 13d1. FIGS. 9 to 11 show an embodiment in using two fifth ceramic sheets 13d1. As shown in FIG. 11, when the refrigerant flow paths T are viewed along a cross-section extending in the extending direction of the slits S and in the stacking direction of the third ceramic sheets 13c, a plurality of, for example, five partitions C are arranged in a sequentially shifted manner in the stacking order of the third ceramic sheets 13c. This forms a "ladder-like chain". That is, referring to the schematic diagram showing the flow of the refrigerant R in FIG. 11, a ladder-like chain L is formed by the partitions C.

In the embodiment of FIG. 8 and the embodiment of FIG. 9 to FIG. 11, a single ladder-like chain L is formed. However, it is preferred that a plurality of ladder-like chains L be formed. For instance, when mounting a plurality of cooling subjects on the heat dissipation device H, a cooling subject, for example, the semiconductor element 12, is arranged at a portion of the mounting surface 15 corresponding to a region between two partitions C of the closest mounting surface 15 in two ladder-like chains L that are adjacent to each other in the extending direction of the slits S. The cooling subject thus becomes closer to the refrigerant R without being obstructed by the partitions C. This effectively performs heat exchange with the refrigerant R.

In such a structure in which the plurality of partitions C are arranged to form the ladder-like chain L, when the refrigerant R is supplied from the external supply pipe P1 to the refrigerant supplying section IN of the heat dissipation device H, the refrigerant R is supplied from the first communication path R1 to the slits S, that is, the refrigerant flow paths T of the third ceramic sheets 13c. The direction of the flow of the refrigerant R is changed by the partitions C forming the step differences, that is, the steps forming the ladder-like chain L. As a result, a radial diffusion flow of the refrigerant R easily occurs in the refrigerant flow path T.

As shown in FIG. 8, the heat dissipation device H of the embodiment is formed by sequentially stacking and sintering the first ceramic sheet 13a, the third ceramic sheets 13c, the fifth ceramic sheet 13d1, and the fourth ceramic sheet 13d. The third ceramic sheets 13c also includes through-holes for forming the first communication path R1 and the second communication path R2 facing the refrigerant supplying section IN and the refrigerant discharging section OUT. The fifth ceramic sheet 13d1 also includes through-holes for forming the first communication path R1 and the second communication path R2. The through-holes of the fifth ceramic sheet 13d1 communicating a fifth communication path R1 to the slits S, that is, the refrigerant flow paths T, or communicating a second communication path R2 to the slits S, that is, the refrigerant flow paths T. The second ceramic sheets 13b may be added to the heat dissipation device H of FIG. 8 without causing any problems.

The first communication path R1 and the second communication path R2 of the refrigerant R extend through the first ceramic sheet 13a and the third ceramic sheets 13c to reach the fifth ceramic sheet 13d1. The first communication path R1 and the second communication path R2 are bent back by the fourth ceramic sheet 13d and communicated to the refrigerant flow paths T. The fourth ceramic sheet 13d forms a bottom plate portion 16 serving as the portion of the heat dissipation device H at the opposite side of the mounting surface 15 on which the cooling subject is mounted. The refrigerant R is supplied from the first communication path R1 of the fifth ceramic sheet 13d1 to the bottom plate portion 16. The refrigerant R that passes the refrigerant flow paths T is entirely gathered at the second communication path R2 of the fifth ceramic sheet 13d1 and discharged by passing through the refrigerant discharging section OUT. Such a structure is preferable since a radial diffusion flow of the refrigerant R can be more easily generated in the refrigerant flow path T.

The first ceramic sheet 13a functions as a top plate including the mounting surface 15 on which the cooling subject is mounted. The thickness of the first ceramic sheet 13a is desirably thinner than other ceramic sheets to more effectively transmit the generated heat of the semiconductor element 12, and the like. For instance, the thickness of the first ceramic sheet 13a is preferably 30% to 50% the thickness of the third ceramic sheets 13c. Further, as described above, the cooling subject, for example, the semiconductor element 12 and the like is arranged between a plurality of ladder-like chains L when mounting the plurality of cooling subjects on the mounting surface 15 of the heat dissipation device H so that heat can be exchanged more effectively between the refrigerant R and the cooling subject.

As shown in FIG. 11, the bottom plate portion 16 of the heat dissipation device H defines the bottom surface of the refrigerant flow path T. The bottom surface preferably includes a projection portion Pr projecting toward the mounting surface 15 of the cooling subject. The refrigerant R supplied to the refrigerant supplying section IN is supplied to the refrigerant flow paths T defined by the third ceramic sheet 13c through the first communication path R1 formed in the first ceramic sheet 13a, the third ceramic sheets 13c, and the fifth ceramic sheet 13d1. In the embodiment shown in FIGS. 9 and 11, the projection portion Pr is stair-shaped and includes two steps formed near the middle of the bottom plate portion 16. The first step of the projection portion Pr is formed by the fifth ceramic sheet 13d1 adjacent to the fourth ceramic sheet 13d. The second step of the projection portion Pr is formed by the fifth ceramic sheet 13d1 that is second from the fourth ceramic sheet 13d. In this manner, as shown in FIGS. 9 and 11, the through-holes of the fifth ceramic sheet 13d1 that is second from the bottom plate portion 16 forming the first communication path R1 and the second communication path R2 are open closer to the middle of the bottom plate portion 16 than the through-holes of the fifth ceramic sheet 13d1 adjacent to the bottom plate portion 16. This forms the two-step projection portion Pr. The embodiment of FIG. 8 includes only one fifth ceramic sheet 13d1. Thus, the projection portion Pr has only one step.

FIG. 11 is a schematic diagram showing the flow of the refrigerant R in a refrigerant flow path T including the projection portion Pr with two steps. The projection portion Pr at the bottom surface of the refrigerant flow path T changes the direction of the flow of the refrigerant R toward the mounting surface 15 on which the cooling subject is mounted, that is, toward the roof portion of the heat dissipation device H. Thus, the heat exchanged between the refrigerant R and the cooling subject is further effectively advanced. The projection portion Pr does not have to be stepped and may be sloped by an inclined plane.

Figure 12A:
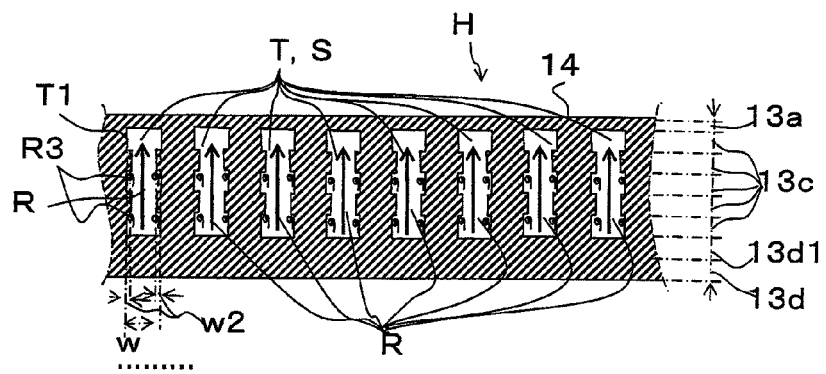
FIGS. 12(a) and 12(b) are cross-sectional views of different embodiments showing the shapes of the refrigerant flow paths each taken along line D-D in the heat dissipation device of FIG. 10.

As shown in FIG. 12(a), when the refrigerant flow path is viewed from beside along a cross-section, that is, when the refrigerant flow path T is viewed along a cross-section perpendicular to the extending direction of the slits S, each of the refrigerant flow paths T may have two side surfaces T1 located at opposite sides of the slit S presenting a symmetric square. When one of the two side surfaces T1 sandwiching the slit S is inverted, the side surface T1 overlaps with the other side surface T1. That is, the two side surfaces T1 sandwiching the slit S are line symmetric. FIG. 12(a) is a cross-sectional view of the refrigerant flow paths T taken along line D-D of FIG. 10 when the heat dissipation device H of FIG. 8 or 9 is assembled and is a cross-sectional view of a location separated from the partition C. As shown in FIG. 12(a), specifically, the side surfaces of each refrigerant flow path T define two boundary lines between the slit S and the base body 14. The two boundary lines extend in the height direction, that is, between the bottom plate portion 16 and the mounting surface 15 like square waves. That is, the two boundary lines between the slit S and the base body 14 are bent to be symmetric at opposite sides of the slit S and bent to cover three sides of a square in FIG. 12(a).

Thus, the refrigerant flow path T of FIG. 12(a) includes repeated large widths and narrow widths in the height direction, that is, between the bottom plate portion 16 and the mounting surface 15. The part of the refrigerant R that hits a narrow width portion in the flow in the height direction forms an eddy flow R3 and causes turbulence. The flow of the refrigerant R in the height direction, for example, from the bottom plate portion 16 to the mounting surface 15 is caused by the projection portion Pr of the bottom plate portion 16 described above. Further, the refrigerant flow path T includes repeated large widths and narrow widths. Thus, the surface area of the refrigerant flow path T becomes wide. The turbulence and the increase in the surface area of the refrigerant flow path T both function to effectively advance heat exchange between the refrigerant R and the base body 14 and increase the cooling capacity.

The "two side surfaces T1 arranged on opposite sides of the slit S are symmetric and square" refers to a state in which the direction of each square, that is, the ridges and valleys of the side surface T1, is symmetric in the side surfaces T1 at opposite sides sandwiching a center of the slit S in between and the projection amount of the squares is approximately the same in the two side surfaces T1. When each refrigerant flow path T, that is, the slit S is not linear, for example, undulated as shown in FIG. 6, the cross-section shown in FIG. 12(a) is a cross-section orthogonal to the advancing direction of the individual refrigerant flow path T (slit S).

The manufacturing method of the refrigerant flow path T shown in FIG. 12(a) prepares a total of two types of third ceramic sheets 13c, in which the dimension of the slit S is large and small. The third ceramic sheets 13c may be alternately stacked and joined in the stacking order. The large widths and the narrow widths of the slit S do not necessarily have to be repeated alternately for each of the third ceramic sheets 13c, and two large widths may continue or three large widths may continue, for example. That is, the large widths and the narrow widths only need to be roughly arranged alternately.

The square projection amount w2 of the side surface T1 is further preferably in a range from 10 μm to 40 μm. When the projection amount w2 is within such a range, the surface area of the refrigerant flow path T can be more widely ensured while suppressing separation that occurs between the third ceramic sheets 13c. The projection amount w2 refers to the dimension in the same direction as the width w of the refrigerant flow path T.

Figure 12B:
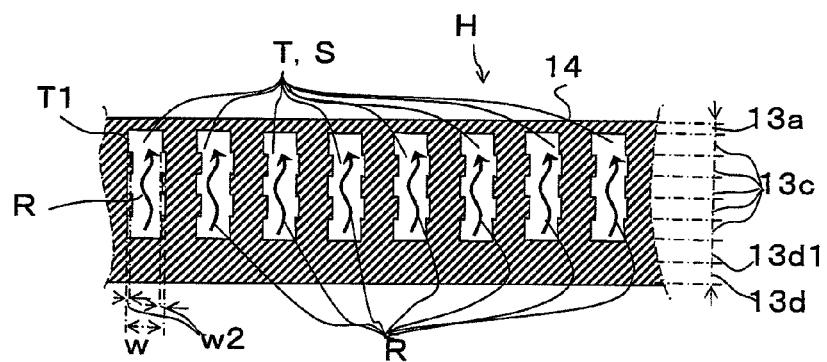

As shown in FIG. 12(b), when the refrigerant flow path is viewed from beside along a cross-section, that is, when the refrigerant flow path T is viewed along a cross-section perpendicular to the extending direction of the slits S, the two side surfaces T1 of the refrigerant flow path T may both be bent in the same direction and bent to cover squares. That is, the side surfaces T1 of the refrigerant flow path T may have identical squares. If one of the two side surfaces T1 sandwiching the slit S undergoes parallel translation in FIG. 12(b), it will overlap the other side surface T1. In such a structure, the refrigerant R follows a crooked flow in the height direction, and the contacting surface area between the refrigerant R and the base body 14 becomes wider. This effectively advances heat exchange between the refrigerant R and the base body 14.

The "two side surfaces T1 having identical squares" refers to a state in which the direction of the squares, that is, the ridges and valleys of the side surface T1 are in the same direction in the two side surfaces and the square projection amount is approximately the same in the two side surfaces T1. When the refrigerant flow path T, that is, the slits S are undulated as shown in FIG. 6, the cross-section shown in FIG. 12(b) shows a cross-section orthogonal to the advancing direction of the each refrigerant flow path T (slit S). The manufacturing method of the refrigerant flow path T shown in FIG. 12(b) may arrange and join a plurality of third ceramic sheets 13c including slits S with one type of dimension so that the stacking positions of the slit S are alternately shifted in the stacking order. The arrangement of the slit S does not necessarily need to be shifted alternately one at a time. For example, two consecutive third ceramic sheets 13c may be stacked without being shifted, or three consecutive third ceramic sheets 13c may be stacked without being shifted. That is, the third ceramic sheets 13c only need to be arranged so that the positions of the slits S are roughly alternately shifted.

The square projection amount w2 of the side surface T1 of FIG. 12(b) is more preferably in a range of 10 μm to 40 μm. If the projection amount w2 is within such range, the surface area of the refrigerant flow path T can be more greatly ensured while suppressing separation that occurs between the third ceramic sheets 13c.

A constriction portion that constricts the refrigerant flow path T in the width direction or the height direction may be arranged in the refrigerant flow path T. The constriction portion is formed in the third ceramic sheets 13c defining the slits S. The third ceramic sheets 13c may include the constriction portion to constrict one or more refrigerant flow paths T. In each embodiment of FIGS. 1 to 7, the passage width of the slit S forming the refrigerant flow path T is constant. If one or more constriction portions are arranged in the refrigerant flow paths T of FIGS. 1 to 7, the refrigerant R produces turbulence when passing the constriction portion. This effectively advances heat exchange between the refrigerant and the fins F and increases the cooling capacity.

Figure 13A:
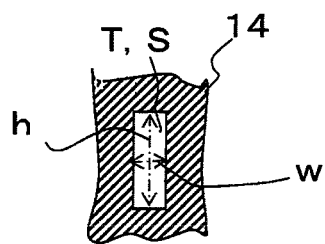
FIGS. 13(a) to 13(c) are partially enlarged schematic diagrams of embodiments with refrigerant flow paths having different cross-sections.
Figure 13C:
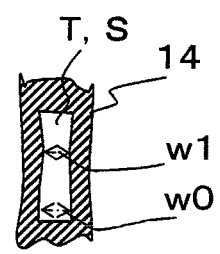
Figure 13B:
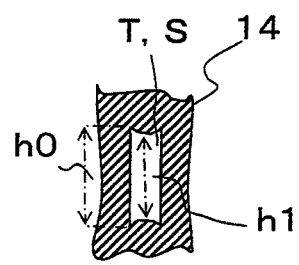

As shown in FIG. 13(b), a constriction portion for constricting the height dimension of the refrigerant flow path T may be used. The ratio of a minimum height dimension h1 of the refrigerant flow path T constricted by the constriction portion with respect to a maximum height dimension h0 of the refrigerant flow path T, that is, minimum height dimension h1/maximum height dimension h0 is preferably greater than or equal to 0.96 and less than 1 ($0.96 \leq h1/h0 < 1$). The "height dimension h of the refrigerant flow path T" refers to the total height dimension h of the plurality of slits S formed by stacking the plurality of third ceramic sheets 13c.

FIG. 13(a) shows a schematic diagram of the refrigerant flow path T along a cross-section perpendicular to the extending direction of the slits S. This case does not include the constriction portion. In the refrigerant flow path T of FIG. 13(b), two constriction portions are arranged at the middle in the width direction of the refrigerant flow path T. That is, the two constriction portions are arranged at upper and lower surfaces of the refrigerant flow path T.

As shown in FIG. 13(b), when a constriction portion for constricting the height dimension of the refrigerant flow path T is present and the ratio of the minimum height dimension h1/maximum height dimension h0 of the refrigerant flow path T obtained by the constriction portion is greater than or equal to 0.96, for example, the occurrence of an abnormality such as the constriction portion obstructing the flow of the refrigerant R can be suppressed. Thus, the supply pipe P1 does not need to significantly increase the supply pressure of the refrigerant R if the minimum height dimension h1/maximum height dimension h0 is greater than or equal to 0.96. If the minimum height dimension h1/maximum height dimension h0 is less than 1, the flow of the refrigerant R is stagnated at an appropriate level by the constriction portion. That is, part of the refrigerant R obstructed by the constriction portion produces an eddy flow. Thus, turbulence is easily produced in the refrigerant R, and heat exchange is effectively advanced between the refrigerant R and the base body 14.

In a manufacturing method that stacks and joins the plurality of ceramic sheets 13, the formation of the constriction portion in the height direction of FIG. 13(b) is performed using a pressurization jig that pressurizes the of ceramic sheets 13 so that the pressurization force when joining the region near the middle in the extending direction of the slit S differs from the pressurization force when joining other portions, for example, the fins F. Then, the ceramic sheets 13 are sintered. The pressurization jig is a plurality of jigs that clamp and pressurize the stacked ceramic sheets 13. At least one jig includes a projecting surface that applies a pressurization force that is higher than other portions toward the slit S. The constriction portion in the height direction that projects into the refrigerant flow path T in the height direction is formed by such high pressurization force. The sintered base body 14 undergoes grinding to flatten the mounting surface 15 on which the cooling subject is to be mounted. Thus, the metal plate 11 for mounting the semiconductor element 12 and the like, which is the cooling subject, can be mounted on the mounting surface 15 of the heat dissipation device H without causing any problems.

As shown in FIG. 13(c), a constriction portion for constricting the width dimension of the refrigerant flow path T may be used. The ratio of a minimum width w1 of the refrigerant flow path T constricted by the constriction portion relative to a maximum width w0 of the refrigerant flow path T, that is, minimum width w1/maximum width w0 is preferably greater than or equal to 0.96 and less than 1 ($0.96 \leq w1/w0 < 1$).

The "minimum width w1 of the refrigerant flow path T" refers to the distance between the walls at the innermost side in the width direction of the refrigerant flow path T.

FIG. 13(a) shows the refrigerant flow path T without the constriction portion even in the width direction. In the refrigerant flow path T of FIG. 13(c), two constriction portions are arranged in the width direction at the middle of the refrigerant flow path T in the height direction. That is, the two constriction portions in the width direction are arranged at two side surfaces of the refrigerant flow path T.

As shown in FIG. 13(c), when a constriction portion for constricting the width dimension of the refrigerant flow path T is present and the ratio of the minimum width w1/maximum width w0 of the refrigerant flow path T obtained by the constriction portion is greater than or equal to 0.96, for example, the occurrence of an abnormality such as the constriction portion obstructing the flow of the refrigerant R can be suppressed. Thus, the supply pipe P1 does not need to significantly increase the supply pressure of the refrigerant R if the minimum width w1/maximum width w0 is greater than or equal to 0.96. If the minimum width w1/maximum width w0 is less than 1, the flow of the refrigerant R is stagnated at an appropriate level by the constriction portion. That is, part of the refrigerant R obstructed by the constriction portion produces an eddy flow, and the disturbed flow of the refrigerant R easily occurs. Thus, heat exchange is effectively advanced between the refrigerant R and the base body 14.

In a manufacturing method that stacks and joins the plurality of ceramic sheets 13, for example, the formation of the constriction portion in the width direction of FIG. 13(c) uses a pressurization jig in the same manner as the formation of the constriction portion in the height direction of FIG. 13(b). The pressurization jig is, for example, a jig that clamps and pressurizes the stacked plurality of ceramic sheets 13. At least one jig includes a projecting surface that applies a pressurization force higher than other portions to between the slits S, that is, the fins F. The constriction portion in the width direction that projects into the refrigerant flow path T in the width direction is formed by such high pressurization force. The sintered base body 14 undergoes grinding to form the mounting surface 15.

The position of the refrigerant inlet, that is, the refrigerant supplying section IN and the position of the refrigerant outlet, that is, the refrigerant discharging section OUT in the heat dissipation device H may be changed. For instance, the refrigerant inlet and the refrigerant outlet may be arranged in the lower surface (bottom surface) of the heat dissipation device H. In this case, the first ceramic sheet 13a forms the bottom plate portion of the heat dissipation device H. The second ceramic sheets 13b are stacked on the first ceramic sheet 13a, the third ceramic sheets 13c are stacked on the second ceramic sheet 13b, and the fourth ceramic sheet 13d is stacked on the third ceramic sheet 13c in this order. In another modification, either one of the refrigerant inlet and the refrigerant outlet may be arranged on the upper surface of the heat dissipation device H, and the other one of the refrigerant inlet and the refrigerant outlet may be arranged on the lower surface of the heat dissipation device H.

The supply pipe P1 and the discharge pipe P2 connected to the heat dissipation device H may be formed from a soft material. That is, pipe lines in at least the heat dissipation device H that connect the refrigerant supplying section IN and the refrigerant discharging section OUT to the fluid source of the refrigerant may be formed from soft material. When the semiconductor device 10 including the semiconductor element 12 joined with the heat dissipation device H is used, for example, for an application in a vehicle, it can be expected that a strong vibration will be applied to the semiconductor device 10. In this structure, a pipe line, such as the supply pipe P1 and the discharge pipe P2, that is formed of a soft material can absorb the vibration of the semiconductor device 10. A particularly preferred soft material has superior heat resistance, high strength, and chemical resistance such as a silicon rubber or phenol resin impregnated cotton base material.

As shown in FIG. 11, the ladder-like chain L is preferably inclined to approach the bottom surface of the refrigerant flow path T along the flowing direction of the refrigerant flow path T from the refrigerant supplying section IN to the refrigerant discharging section OUT. The plurality of partitions C forming the ladder-like chain L are preferably arranged so that the ladder-like chain L is inclined in such manner. In this case, the position where the refrigerant R supplied from the refrigerant supplying section IN to the refrigerant flow path T through the first formation section Ta passes the ladder-like chain L is sequentially shifted from the mounting surface 15 toward the bottom surface of the refrigerant flow path T along the flowing direction of the refrigerant R from the refrigerant supplying section IN to the refrigerant discharging section OUT. That is, in the flow of the refrigerant R in the refrigerant flow path T, the partitions C produce a radial diffusion flow as shown in FIG. 11 such that the refrigerant R flowing toward the mounting surface 15 is evenly diffused. Thus, heat exchange is evenly advanced over the front surface of the mounting surface 15, and the cooling capacity can be further increased.

In the above embodiment, the heat dissipation device H mounts the cooling subject. However, the application of the present invention is not limited to a heat dissipation device and may be applied to a heat exchanging device used for heating. That is, the present invention not limited to a device including refrigerant flow paths T through which the refrigerant R flows and may be a device including a flow path through which fluid including liquid or gas flows.

EXAMPLE

The dimensions of a preferred square wave form in the side surfaces T1 of the refrigerant flow path T shown in FIG. 12(a) and FIG. 12(b) were checked. This will be described with reference to FIGS. 14(a) and 14(b).

In the present example, a total of eight layers were stacked, a first ceramic sheet 13a, fiver third ceramic sheets 13c, a fifth ceramic sheet 13d1, and a fourth ceramic sheet 13d, as shown in FIG. 8. The projection portion Pr included one step. After the ceramic sheets 13a, 13c, 13d1, and 13d were joined and sintered, the thickness of the first ceramic sheet 13a was 0.5 mm. The thickness of the third ceramic sheet 13c, the thickness of the fifth ceramic sheet 13d1, and the thickness of the fourth ceramic sheet 13d after sintering were each 1 mm. The width w of the slit S was 1 mm, and the length of the slit S in the extending direction e was 180 mm. The distance between the adjacent slits S, that is, the width of the fins F was 1 mm. Eight linear slits S were formed. The dimension of the outer side of the heat dissipation device H was 220 mm (dimension in flowing direction)×50 mm (width dimension).

Powders of aluminum oxide, silicon oxide, calcium oxide and magnesium oxide were mixed. Then, a binder of which main component is an acrylic resin was mixed with the mixture to obtain a slurry.

The slurry was then processed through a known doctor blade technique to produce a flat ceramic sheet. The ceramic sheet then undergoes processing with a die to produce each ceramic sheet 13. Such ceramic sheets 13 obtain a product shape when stacked.

In order to stack, pressurize, and join the ceramic sheets 13, an adhering liquid, which is equivalent to the slurry, was applied to the joining portion of the ceramic sheets 13 through the known screen printing method.

The ceramic sheets 13 were then stacked, and a Prescale (manufactured by Fuji Film Corporation, model: LLLW for ultralow pressure of 0.2 to 0.6 MPa) was sandwiched at the lowermost layer to observe the pressure propagation state of the ceramic sheets 13. The Prescale was used to observe whether a uniform pressurization force was applied over the entire surface of the stacked ceramic sheets 13. The pressurization force of the ceramic sheet 13 was determined by the color generation degree of red, which was indicated by the Prescale.

The stacked ceramic sheets 13 and the Prescale were then clamped with the pressurization jig and pressurized to 0.5 MPa. The pressurized Prescale was checked. When color generation occurred in a sparse manner, pressurization was performed again or the ceramic sheet 13 was discarded as being defective.

Then, sintering was carried out at a maximum temperature (1600° C. in the present example) of about 1500° C. to 1650° C. using a tunnel baking furnace in an oxidizing atmosphere. As a result, the heat dissipation device H, which is a ceramic sintered body containing 96% by mass of an aluminum oxide, was obtained.

Figure 14A:
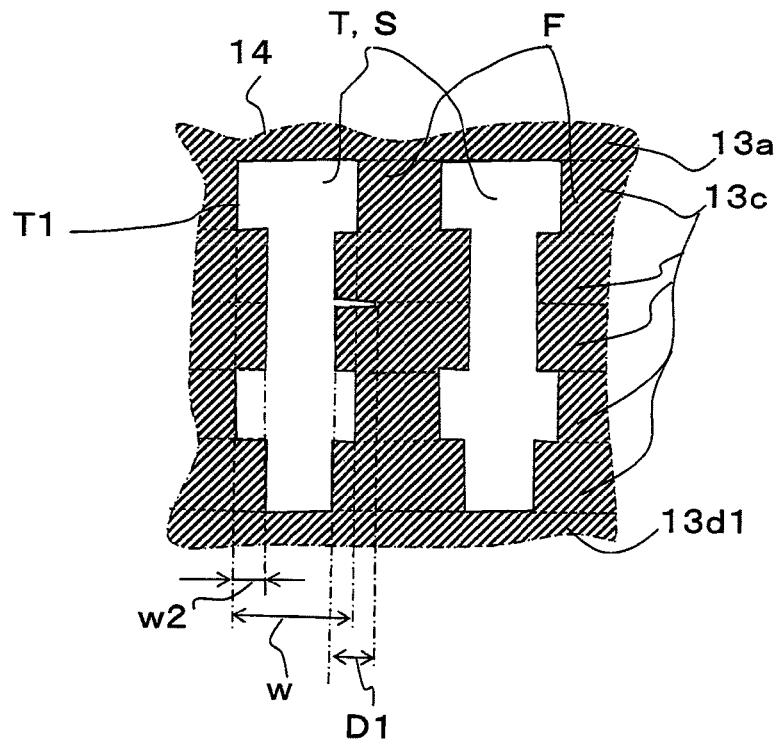
FIGS. 14(a) and 14(b) are partially enlarged cross-sectional views of embodiments having different refrigerant flow paths.
Figure 14B:
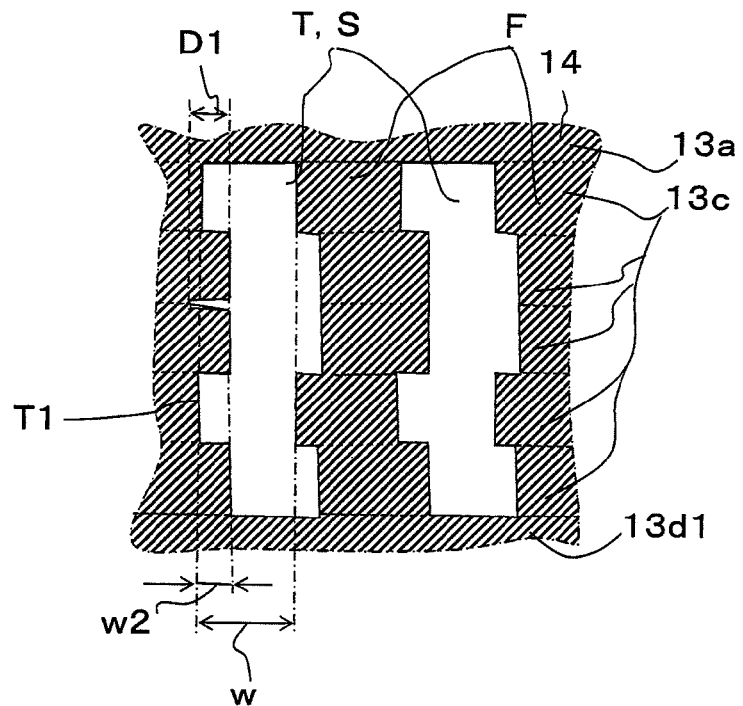

FIGS. 14(a) and 14(b) are partially enlarged cross-sectional views of the heat dissipation device H taken along line D-D in FIG. 10 and showing a cross-section perpendicular to the extending direction e of the refrigerant flow path T. FIG. 14(a) shows an example in which the side surfaces T1 of the refrigerant flow path T form square undulated lines that are symmetric as shown in FIG. 12(a). The third ceramic sheets 13c that are third and fourth from the bottom include two continuous slits S, which are narrow. FIG. 14(b) shows an example in which the side surfaces T1 of the refrigerant flow path T form square undulated lines that are identical as shown in FIG. 12(b). The third ceramic sheets 13c that are third and fourth from the bottom include two continuous slits S stacked in a state shifted toward the right of FIG. 14(b).

The refrigerant flow paths T included in a single heat dissipation device H have the same shape and same dimensions. The refrigerant flow paths T are produced so that the slits S of the five third ceramic sheets 13c have different dimensional values. In the two side surfaces T1 having symmetric square waves as shown in FIG. 14(a), the width between the square recesses was indicated as w, and the square projection amount, or shift amount, was indicated as w2. As shown in FIG. 14(b), in the two side surfaces T1 having identical square waves, the width between the square ridges and valleys facing each other in the width direction was indicated as w, and the square projection amount was indicated as w2. The specimens listed in the table 1 shown below was then prepared.

An ultrasonic flaw detection test was conducted to observe the joining state of the stacked ceramic sheets 13 for each specimen of the heat dissipation device H obtained as described above.

In the ultrasonic flaw detection test, the model miscopehyper and ultrasonic probe models 50P6F15 and PT-3-25-17 manufactured by Hitachi Construction Machinery Co. Ltd. were used. The joining portions of the specimen were searched at frequencies of 50 MHZ and 25 MHZ. The state of separation between layers, which is a joint defect of the ceramic sheets 13, was observed in the image obtained through each ultrasonic flaw detection test. The depth of separation that appeared in the cross-section perpendicular to the extending direction, that is, the side cross-section of the refrigerant flow paths T is indicated by D1. A total of ten specimens were prepared by selecting the specimens in which the square projection amount w2 of the refrigerant flow paths T of each heat dissipation device H and the depth D1 of separation were within the range of the table 1.

A heater and a thermocouple were then attached to the mounting surface 15 of each specimen of the heat dissipation device H. The heater and the thermocouple heated the mounting surface 15 to a temperature of 80° C.

The water of 18° C. was then supplied as the refrigerant R under a pressure of 0.5 MPa to the refrigerant supplying section IN. After 30 minutes elapsed, the temperature of the mounting surface 15 was measured, and its average value was obtained.

After the cooling test was finished, the ultrasonic flaw detection test was performed on each specimen to measure the depth D1 of separation. In the image obtained by the ultrasonic flaw detection test, a white image is displayed when a void exists, and a black image is displayed when a void does not exist. However, the depth D1 of a fine separation cannot actually be shown with a measurement value. Thus, the depth D1 of separation is obtained with an SEM image in advance using the cross-section of the specimen with separation between layers of the ceramic sheet. This is compared with the actually obtained image to obtain a numerical value of the depth D1 indicating separation.

The data that was obtained is shown in table 1.

TABLE 1

| Specimen No. | Cross-Sectional Shape of Refrigerant Flow Path | Square Projection Amount (Shift Amount) w2 (μm) | Maximum Value of Separation Depth D1 Prior to Cooling Test (μm) | Mounting Surface Temperature After 30 Minutes (° C.) | Maximum Value of Separation Depth D1 After Cooling Test (μm) |
|---|---|---|---|---|---|
| 1 | Symmetric | 0 ≤ w2 < 10 | 1 | 38 | 2 |
| 2 | Square | 10 ≤ w2 < 30 | 3 | 31 | 4 |
| 3 | Shape | 30 ≤ w2 < 40 | 6 | 25 | 8 |
| 4 |  | 40 ≤ w2 < 50 | 12 | 24 | 14 |
| 5 |  | 50 ≤ w2 < 60 | 14 | 23 | 18 *1 1 Breakage |
| 11 | Identical | 0 ≤ w2 < 10 | 1 | 37 | 2 |
| 12 | Square | 10 ≤ w2 < 30 | 3 | 29 | 4 |
| 13 | Shape | 30 ≤ w2 < 40 | 7 | 23 | 9 |
| 14 |  | 40 ≤ w2 < 50 | 13 | 22 | 15 |
| 15 |  | 50 ≤ w2 < 60 | 15 | 22 | 19 *1 1 Breakage |

Table 1 shows specimen No. 1 to No. 5 in which the side surfaces T1 of the refrigerant flow paths T have square shapes that are symmetric like FIG. 14(a), and specimen No. 11 to No. 15 in which the side surfaces T1 have identical shapes like FIG. 14(b). In specimen Nos. 1 to 5 and specimen Nos. 11 to 15, the cooling effect was enhanced as the square projection amount w2 increased.

It is also apparent that the cooling efficiency was higher with the identical square shapes of Nos. 11 to 15 than with the symmetric square shapes of Nos. 1 to 5. It is understood that this is because with the identical square shapes of Nos. 11 to 15, the refrigerant R flows in a crooked manner in the height direction so that heat exchange is performed further efficiently between the base body 14 and the refrigerant R.

In specimen Nos. 4 and 5 and specimen Nos. 14 and 15 in which the square projection amount w2 was greater than or equal to 40 μm, the depth D1 of separation in the side surfaces T1 of the refrigerant flow path T prior to the cooling test was large having a maximum value of 6 μm to 15 μm. It is understood that this is because the pressurization force when stacking and joining the ceramic sheets 13 is not sufficiently propagated to the square portions in the side surfaces T1. The high-pressure water supplied for a predetermined time resulted in a flow path breakage occurring in a single refrigerant flow path T in each of specimen No. 5 and specimen No. 15. The flow path breakage is believed to have occurred from a starting point located in an area where the depth D1 of separation in the side surface T1 is the largest.

The following is apparent in relation with the square projection w2 with regard to the two aspects of the cooling effect and the resistance to separation between the layers of the ceramic sheets 13 (flow path breakage). The square projection amount w2, which is the shift amount of the ceramic sheets 13, is preferably set in a range of greater than or equal to 10 μm to less than 50 μm, and more preferably set to greater than or equal to 10 μm and less than 40 μm.

DESCRIPTION OF REFERENCE CHARACTERS 10) semiconductor device
11) metal plate
12) semiconductor element
13a to 13d1) ceramic sheets
14) base body
15) mounting surface
16) bottom plate portion
H) heat dissipation device
IN) refrigerant supplying section forming part of first communication path
OUT) refrigerant discharging section forming part of second communication path
Ta) passage formation section forming part of first communication path
Tb) passage formation section forming part of second communication path
T) refrigerant flow path
T1) side surface
e) extending direction of slit
S) slit
C) partition
R1) first communication path
R2) second communication path
P1) supply pipe
P2) discharge pipe
R) refrigerant
R1) eddy flow
Pr) projection portion
L) step
h) height dimension of refrigerant flow path (slit)
h0) maximum height dimension of refrigerant flow path (slit)
h1) minimum height dimension of refrigerant flow path (slit)
w) width of refrigerant flow path (slit)
w0) maximum width of refrigerant flow path (slit)
w1) minimum width of refrigerant flow path (slit)
w2) square projection amount, shift amount
D1) depth of separation

The invention claimed is:

1. A heat dissipation device including a base body, which is formed from a ceramic, and a plurality of refrigerant flow paths, through each of which a refrigerant flows in the base body, wherein
the base body is formed by sintering a stacked body, which is formed by stacking ceramic sheets,
the ceramic sheets include a plurality of ceramic sheets, each of which has a plurality of slits forming the plurality of refrigerant flow paths and a ceramic sheet that has a communication path that interconnects the plurality of refrigerant flow paths and an exterior of the heat dissipation device,
the plurality of slits defines a plurality of fins partitioning the plurality of refrigerant flow paths,
the heat dissipation device has a mounting portion on which a cooling subject that is to be cooled is mounted,
the plurality of slits is formed so that the plurality of refrigerant flow paths formed in the heat dissipation device is arranged at a position corresponding to the mounting portion,
each of the plurality of refrigerant flow paths includes at least one partition that partitions a slit in an extending direction of the slit,
when the plurality of refrigerant flow paths is viewed along a cross-section extending in the extending direction of the slit and extending in a stacking direction of the ceramic sheets, the heat dissipation device includes a bottom plate portion located at an opposite side of a mounting portion,
the bottom plate portion defines a bottom surface of the plurality of refrigerant flow paths,
the bottom surface of the plurality of refrigerant flow paths includes a projection portion projecting toward the mounting portion,
the projection portion and the partition face each other along a projecting direction of the projection portion so that the refrigerant flow paths are located between the projection portion and the partition,
the partition and the mounting portion face each other along the projecting direction of the projection portion so that the refrigerant flow paths are located between the partition and the mounting portion.

2. The heat dissipation device according to claim 1, wherein
the base body includes a mounting surface on which the cooling subject is mounted, and
the communication path includes a refrigerant inlet and a refrigerant outlet that open in the mounting surface.

3. The heat dissipation device according to claim 1, wherein
the base body includes a mounting surface on which the cooling subject is mounted, and
the plurality of refrigerant flow paths is formed to be undulated in a planar view of the base body viewed from the mounting surface.

4. The heat dissipation device according to claim 1, wherein each of the plurality of ceramic sheets that includes the plurality of slits is formed from a material having high mechanical strength.

5. The heat dissipation device according to claim 1, wherein
a plurality of partitions form at least one ladder-like chain, and
the ladder-like chain is formed so that the plurality of partitions are arranged in a state sequentially shifted in an order in which the ceramic sheets are stacked when the plurality of refrigerant flow paths is viewed along the cross-section extending in the extending direction of the slit and extending in the stacking direction of the ceramic sheets.

6. The heat dissipation device according to claim 1, wherein
when viewing the plurality of refrigerant flow paths along a cross-section perpendicular to the extending direction of the slit, two side surfaces of each of the plurality of refrigerant flow paths form two boundary lines between the slit and the base body, and
the two boundary lines are bent to be symmetric at opposite sides of the slit and each have a bent shape to cover a square.

7. The heat dissipation device according to claim 1, wherein
when viewing the plurality of refrigerant flow paths along a cross-section perpendicular to the extending direction of the slit, two side surfaces of each of the plurality of refrigerant flow paths form two boundary lines between the slit and the base body, and
the two boundary lines are both bent in a same direction and each have a bent shape to cover a square.

8. The heat dissipation device according to claim 1, wherein each of the plurality of refrigerant flow paths includes at least one constriction portion that constricts each of the plurality of refrigerant flow paths in a width direction or a height direction.

9. A semiconductor device including
a semiconductor element,
a metal plate on which the semiconductor element is mounted, and
the heat dissipation device according to claim 1 that is joined with the metal plate, wherein
the base body of the heat dissipation device includes a mounting surface on which the cooling subject is mounted; and
the metal plate is joined with the mounting surface to form the semiconductor device.

10. The semiconductor device according to claim 9, wherein
a supply pipe that supplies the refrigerant to the plurality of refrigerant flow paths is arranged at a refrigerant inlet of the communication path,
a discharge pipe that discharges the refrigerant from the plurality of refrigerant flow paths to the exterior is arranged at a refrigerant outlet of the communication path; and
the supply pipe and the discharge pipe are formed from a soft material.

11. The semiconductor device according to claim 9, wherein
the heat dissipation device includes a refrigerant supplying section to which a refrigerant is supplied, a refrigerant discharging section from which the refrigerant is discharged;
each of the plurality of refrigerant flow paths includes a plurality of partitions that partition the plurality of slits in an extending direction of the plurality of slits;
the plurality of partitions forms at least one ladder-like chain;
the ladder-like chain is formed so that partitions are arranged in a state sequentially shifted in an order in which the ceramic sheets are stacked when the plurality of refrigerant flow paths is viewed along a cross-section extending in the extending direction of the plurality of slits and extending in a stacking direction of the ceramic sheets; and
the partitions forming the ladder-like chain are arranged so that the ladder-like chain is inclined to approach the bottom surface of the plurality of refrigerant flow paths along a flowing direction of the plurality of refrigerant flow paths from the refrigerant supplying section to the refrigerant discharging section.

* * * * *